(12) United States Patent
Namgung et al.

(10) Patent No.: US 11,388,361 B2
(45) Date of Patent: Jul. 12, 2022

(54) IMAGE SENSOR, IMAGING DEVICE INCLUDING IMAGE SENSOR, AND METHOD OF OPERATING IMAGING DEVICE

(71) Applicant: SAMSUNG ELECTRONICS CO., LTD., Suwon-si (KR)

(72) Inventors: Seol Namgung, Seoul (KR); Seungnam Choi, Hwaseong-si (KR); Jeongseok Kim, Suwon-si (KR); Junseok Kim, Hwaseong-si (KR); Jongwoo Bong, Seoul (KR); Yunjae Suh, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/992,330

(22) Filed: Aug. 13, 2020

(65) Prior Publication Data

US 2021/0185259 A1    Jun. 17, 2021

(30) Foreign Application Priority Data

Dec. 13, 2019    (KR) .................. 10-2019-0166534

(51) Int. Cl.
| | |
|---|---|
| *H04N 5/378* | (2011.01) |
| *H04N 5/345* | (2011.01) |
| *H04N 5/3745* | (2011.01) |
| *H04N 5/357* | (2011.01) |
| *G06T 5/50* | (2006.01) |
| *H01L 27/146* | (2006.01) |

(52) U.S. Cl.
CPC ............. *H04N 5/378* (2013.01); *G06T 5/50* (2013.01); *H04N 5/3454* (2013.01); *H04N 5/357* (2013.01); *H04N 5/3745* (2013.01); *G06T 2207/20221* (2013.01); *H01L 27/14603* (2013.01); *H01L 27/14621* (2013.01); *H01L 27/14627* (2013.01); *H01L 27/14645* (2013.01)

(58) Field of Classification Search
None
See application file for complete search history.

(56) References Cited

U.S. PATENT DOCUMENTS

| | | | |
|---|---|---|---|
| 5,148,013 A | | 9/1992 | Yamada |
| 5,786,588 A | * | 7/1998 | Takahashi .......... H04N 9/04561 250/208.1 |
| 6,784,928 B1 | * | 8/2004 | Sakurai .................. H04N 5/343 348/220.1 |

(Continued)

FOREIGN PATENT DOCUMENTS

| | | |
|---|---|---|
| JP | 2011211553 A | 10/2011 |
| JP | 2017076887 A | 4/2017 |

(Continued)

*Primary Examiner* — James M Hannett
(74) *Attorney, Agent, or Firm* — Sughrue Mion, PLLC

(57) ABSTRACT

An imaging device, image sensor and method are provided. A first scanning operation is performed on a pixel array in a first direction by a first selection circuit to generate first frame data by first readout circuit. A second scanning operation is performed on the pixel array in a second direction different from the first direction to generate second frame data by a second selection circuit. The first and second frame data are merged into single frame data by an image signal processor.

15 Claims, 19 Drawing Sheets

(56) References Cited

U.S. PATENT DOCUMENTS

| | | | | |
|---|---|---|---|---|
| 7,565,033 | B2* | 7/2009 | Hanson | H04N 3/1593 |
| | | | | 382/304 |
| 7,859,581 | B2* | 12/2010 | Guidash | H04N 5/369 |
| | | | | 348/302 |
| 8,564,690 | B2* | 10/2013 | Shibata | H04N 9/8042 |
| | | | | 348/230.1 |
| 9,426,400 | B2 | 8/2016 | Brown et al. | |
| 10,277,856 | B2* | 4/2019 | Okura | H04N 5/3532 |
| 2006/0119715 | A1 | 6/2006 | Nam | |
| 2016/0316166 | A1* | 10/2016 | Kubo | H04N 5/37455 |
| 2018/0208191 | A1 | 7/2018 | Eidenberger et al. | |

FOREIGN PATENT DOCUMENTS

| | | |
|---|---|---|
| KR | 1020060062334 A | 6/2006 |
| KR | 101319542 B1 | 10/2013 |
| WO | 2017012856 A1 | 1/2017 |

* cited by examiner

IMAGE SENSOR, IMAGING DEVICE INCLUDING IMAGE SENSOR, AND METHOD OF OPERATING IMAGING DEVICE

CROSS-REFERENCE TO RELATED APPLICATION

This application claims priority from Korean Patent Application No. 10-2019-0166534 filed on Dec. 13, 2019 in the Korean Intellectual Property Office, the disclosure of which is incorporated by reference herein in its entirety.

BACKGROUND

1. Field

The present disclosure relates to an image sensor, an imaging device including the image sensor, and a method of operating the imaging device.

2. Description of Related Art

In general, image sensors convert optical images into electrical signals. With recent developments in the computer and communications industries, there is increasing demand for improved image sensors in various fields. Image sensors include charge-coupled devices (CCDs) and complementary metal-oxide-semiconductor (CMOS) image sensors. Among such image sensors, CMOS image sensors may be easily driven, and a signal processing circuit may be integrated on a single chip to miniaturize products. With significantly low power consumption, CMOS image sensors may be used in products having limited battery capacity. In addition, CMOS image sensors may be used interchangeably with CMOS process technology to reduce manufacturing costs. Accordingly, the use of CMOS image sensors is rapidly increasing as high resolution is implemented with technological development.

SUMMARY

It is an aspect to provide an image sensor that reduces a propagation delay effect, an imaging device including the image sensor, and a method of operating the image sensor.

According to an aspect of an example embodiment, there is provided an imaging device comprising a pixel array including a plurality of pixels disposed between a plurality of row lines and a plurality of column lines; a plurality of selection circuits connected to the plurality of row lines and configured to select one of the plurality of row lines; a plurality of readout circuits connected to the plurality of column lines, and configured to receive pixel voltages from pixels connected to the plurality of column lines and to output pixel data corresponding to the received pixel voltages, the plurality of readout circuits being enabled in correspondence with an enabled selection circuit among the plurality of selection circuits; and an image signal processor configured to receive a plurality of frame data corresponding to the pixel array from the plurality of readout circuits and to perform an operation on the plurality of frame data to generate a single frame data, wherein the plurality of frame data are generated by scanning the pixel array in at least two directions by the plurality of readout circuits and the plurality of selection circuits.

According to another aspect of an example embodiment, there is provided an image sensor comprising a pixel array including a plurality of pixels disposed between a plurality of row lines and a plurality of column lines; a first selection circuit disposed below the pixel array, connected to the plurality of row lines, and configured to perform a first selection operation to select one of the plurality of row lines; a second selection circuit disposed above the pixel array, connected to the plurality of row lines, and configured to perform a second selection operation to select one of the plurality of row lines; a first readout circuit disposed on the left of the pixel array, connected to the plurality of column lines, and configured to receive pixel voltages from pixels connected to the selected row line and the plurality of column lines and to output pixel data corresponding to the received pixel voltages, the first readout circuit being enabled in correspondence with one enabled selection circuit among the first selection circuit and the second selection circuit; and a second readout circuit disposed on the right of the pixel array, connected to the plurality of column lines, and configured to receive pixel voltages from the selected row line and the plurality of column lines and to output pixel data corresponding to the received pixel voltages, the second readout circuit being enabled in correspondence with the other enabled selection circuit among the first selection circuit and the second selection circuit, wherein the first selection circuit performs the first selection operation in a first direction, and the second selection circuit performs the second selection operation in a second direction, different from the first direction.

According to yet another aspect of an example embodiment, there is provided a method of operating an imaging device, the method comprising performing a first scanning operation on a pixel array including a plurality of pixels disposed between a plurality of row lines and a plurality of column lines to generate first frame data, the first scanning operation being performed in a first direction by a first selection circuit and a first readout circuit; performing a second scanning operation on the pixel array to generate second frame data, the second scanning operation being performed in a second direction different from the first direction, by a second selection circuit and a second readout circuit; and merging, by an image signal processor, the first frame data and the second frame data.

According to yet another aspect of an example embodiment, there is provided an image sensor comprising a pixel array including a plurality of pixels disposed at respective intersections of a plurality of row lines and a plurality of column lines; a first selection circuit connected to the plurality of row lines; a second selection circuit connected to the plurality of row lines; a readout circuit connected to the plurality of column lines; wherein the first selection circuit performs a first scanning operation in a first direction in conjunction with the readout circuit to generate first frame data, wherein the second selection circuit performs a second scanning operation in a second direction different from the first direction in conjunction with the readout circuit to generate second frame data, and wherein the first frame data and the second frame data are merged to produce a single frame data.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, example embodiments will be described with reference to the accompanying drawings.

Figure 1:
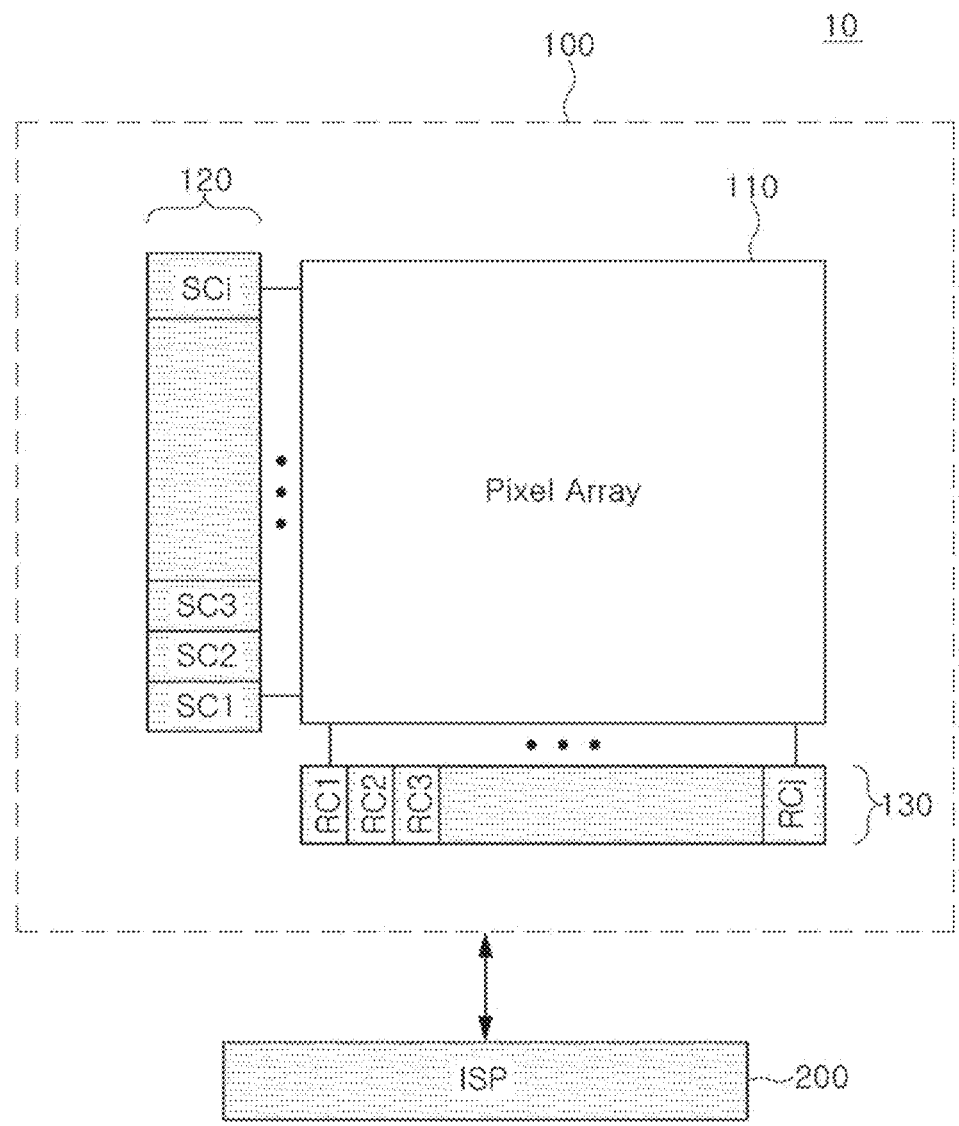
FIG. 1 illustrates an imaging device according to an example embodiment.

FIG. 1 illustrates an imaging device 10 according to an example embodiment. Referring to FIG. 1, the imaging device 10 may include an image sensor 100 and an image signal processor (ISP) 200. It is noted that the imaging device 10 is illustrated schematically in FIG. 1 for conciseness.

The image sensor 100 may be configured to detect an object. The image sensor 100 may include a pixel array 110, a plurality of selection circuits 120 (SC1 to SCi), and a plurality of readout circuits 130 (RC1 to RCj).

The pixel array 110 may include a plurality of pixels disposed in an array form of a plurality of row lines and a plurality of column lines. Each of the plurality of pixels may include a color filter to pass specific wavelengths of light. For example, the color filter may be at least one of a red filter passing the wavelengths of light in a red spectrum among wavelengths of light in a visible spectrum, a green filter passing wavelengths of light in a green spectrum among wavelengths of light in the visible spectrum, or a blue filter passing wavelengths of light in a blue spectrum among the wavelengths of light in the visible spectrum. In addition, the color filter may be at least one of a cyan filter, a yellow filter, and a magenta filter.

In example embodiments, each of the plurality of pixels may include a photoelectric transformation element. For example, each of the plurality of pixels may include a photodiode that generates a charge in response to an externally incident optical signal, and a pixel circuit that generates an electrical signal corresponding to the charge generated from the photodiode. For example, the photodiode may be a PIN photodiode having a structure in which an intrinsic semiconductor layer is inserted between PN junctions. For another example, the photodiode may be an APD photodiode in which an avalanche layer is present between PN junctions.

In example embodiments, each of the plurality of pixels may include at least two photodiodes. For example, each of the pixels may include at least two photodiodes to generate a pixel signal corresponding to light of various colors or to provide an autofocusing function.

Each of the plurality of pixels may include a pixel circuit that generates a pixel signal from charges generated by the photodiodes. The pixel circuit may include a transfer transistor, a driving (source-follower) transistor, a select transistor, a reset transistor, and at least one conversion gain transistor. The pixel circuit may obtain a pixel signal by detecting a reset voltage and a pixel voltage from each of the plurality of pixels and calculating a difference between the reset voltage and the pixel voltage. The pixel voltage may correspond to charges generated by photodiodes included in each of the plurality of pixels.

In example embodiments, at least two pixels adjacent to each other may constitute a single pixel group. Two or more pixels, included in the pixel group, may share at least a portion of the transfer transistor, the drive transistor, the select transistor, the reset transistor, and the conversion gain transistor.

The selection circuits 120 (SC1 to SCi) may be configured to drive the pixel array 110 in units of rows. For example, the selection circuits 120 (SC1 to SCi) may generate a transmission gating signal for controlling the transfer transistor of the pixel circuit, a reset gating signal for controlling the reset transistor, or a selection signal for controlling the selection transistor.

Each of the selection circuits 120 (SC1 to SCi) may perform a scanning operation on a single pixel array 110 in different directions to each other. For example, the first selection circuit SC1 may generate control signals to scan the pixel array 110 in a first direction. The i-th selection circuit SCi may generate control signals to scan the pixel array 110 in an i-th direction. The i-th direction and the first direction may be different from each other.

The readout circuits 130 (RC1 to RCj) may be configured to convert an analog pixel signal, generated from the pixel array 110, into a digital signal and to output the converted digital signal. The readout circuits 130 (RC1 to RCj) may include a sampling circuit and an analog-to-digital converter (ADC). The sampling circuit may include a plurality of samplers. For example, the sampler may be a correlated double sampler (CDS). The sampler is connected to pixels, included in a row line selected by the selection circuits 120 (SC1 to SCi), through column lines and detects a reset voltage and a pixel voltage from corresponding pixels. The samplers may compare each of the reset voltage and the pixel voltage with a ramp voltage, and may output a comparison result. The analog-to-digital converter may convert the comparison result, output by the samplers, into a digital signal. The analog-to-digital converter may convert the reset voltage and pixel voltage, detected by the correlated double sampler, into a digital signal and may transfer the converted digital signal to a column driver. The column driver may include a latch or buffer circuit and an amplifier circuit which may temporarily store digital signal. The column driver may process the digital signal received from the readout circuits 130 (RC1 to RCj).

A timing controller may be configured to control operational timing of the selection circuits 120 (SC1 to SCi), the readout circuits 130 (RC1 to RCj), and/or the column driver. For example, the timing controller may control operational timing to read out frames scanned in different directions from the readout circuits 130 (RC1 to RCj).

The image signal processor (ISP) 200 may be configured to process image data output from the readout circuits 130 (RC1 to RCj). For example, the image signal processor 200 may process image data to generate a result image and may transmit the result image to a display or store the result image in a memory. For example, the image signal processor 200 may perform a signal processing operation, such as color interpolation, color correction, gamma correction, color space conversion, edge correction, or the like, on the received frame data to generate image data.

In addition, the image signal processor 200 may perform an operation (for example, an averaging operation) on frames, output from the readout circuits 130 (RC1 to RCj) as a result of scanning operations in different directions, to generate a single frame.

In a related art image sensor, a readout circuit is offset to one side. Accordingly, the data of pixels distant from the readout circuit may be likely to be distorted and lost. The selection circuit selects a column or a row of a pixel in only one fixed direction. For example, the selection circuit may select columns from bottom to top. Accordingly, a column/row that is selected last is always significantly affected by a propagation delay. Recently, as a pixel size is decreased and the number of pixels is increased, an image sensor including a plurality of readout circuits has been released. However, even in this case, pixel selection of the selection circuit is fixed in one direction. Accordingly, there is still an issue of the propagation delay.

By contrast, the imaging device 10 according to an example embodiment may scan a single pixel array 100 in different directions, and may perform an operation on a plurality of frames output as a result of the scanning operations and use the plurality of frames as an acquired image. Thus, the imaging device 10 according to an example embodiment may significantly reduce a propagation delay, as compared with an imaging device according to the related art.

Figure 2:
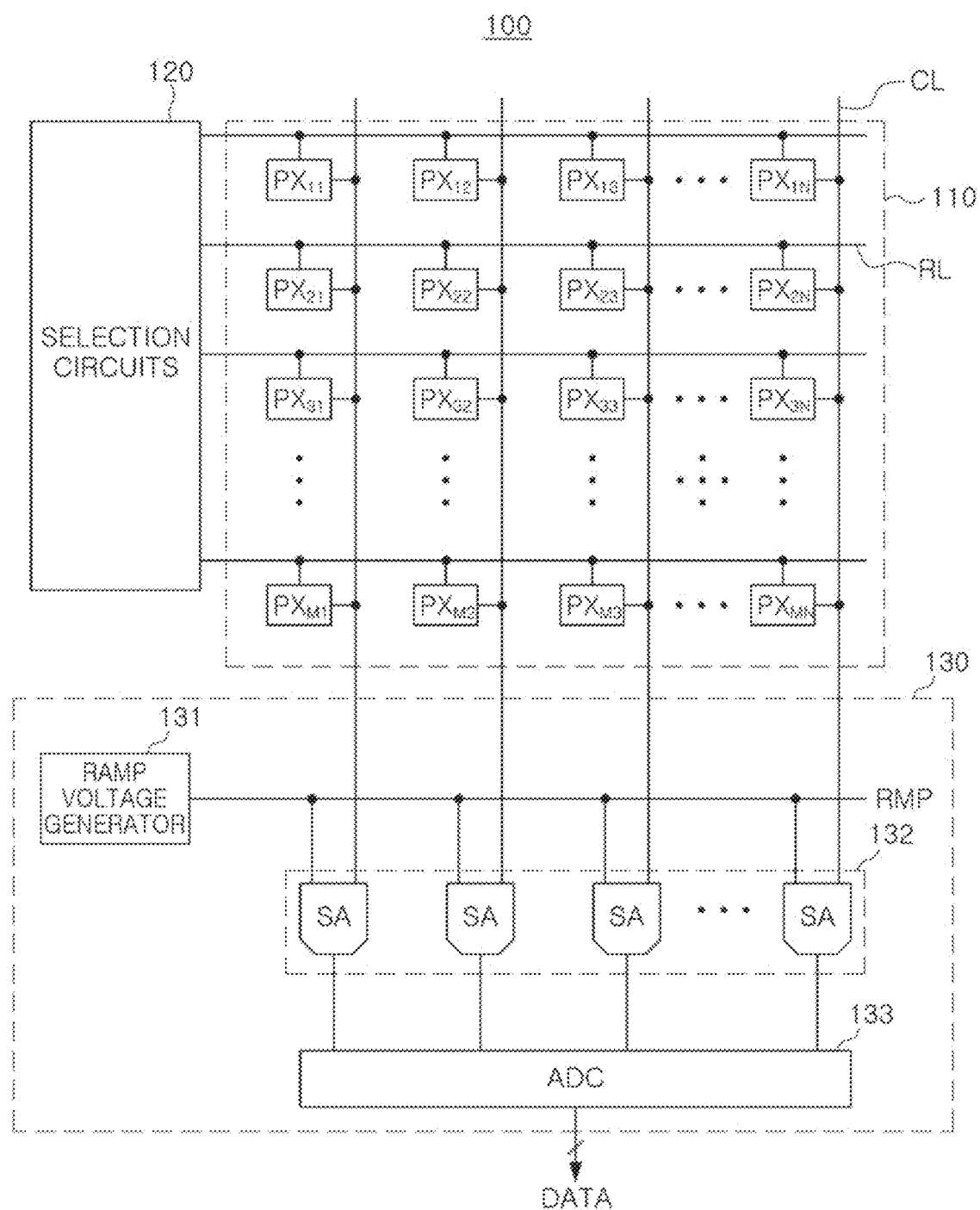
FIG. 2 illustrates an image sensor according to an example embodiment.

FIG. 2 illustrates an image sensor 100 according to an example embodiment. Referring to FIG. 2, the image sensor 100 may include a pixel array 110, selection circuits 120 (SC1 to SCi), and readout circuits 130 (RC1 to RCj). It is noted that the image sensor 100 is illustrated schematically in FIG. 2 for conciseness.

The pixel array 110 may include a plurality of pixels $PX_{11}$ to $PX_{MN}$ provided at intersections of a plurality of row lines RL and a plurality of column lines CL. For example, in some example embodiments, each of the plurality of pixels $PX_{11}$ to $PX_{MN}$ may be a complementary metal-oxide-semiconductor image senor (CIS) pixel.

The selection circuits 120 (SC1 to SCi) may input a signal to control the plurality of pixels $PX_{11}$ to $PX_{MN}$ through the plurality of row lines RL. For example, the selection circuits 120 (SC1 to SCi) may provide a reset gating signal RG, a transmission gating signal TG, or a selection signal SEL to the plurality of pixels $PX_{11}$ to $PX_{MN}$ through the plurality of row lines RL. The selection circuits 120 (SC1 to SCi) may sequentially select the plurality of row lines RL. The selection circuits 120 (SC1 to SCi) may select one of the plurality of row lines RL during a horizontal period. The horizontal period may be predetermined.

The readout circuits 130 (RC1 to RCj) may include a ramp voltage generator 131, a sampling circuit 132, and an analog-to-digital converter 133. Data, output by the analog-to-digital converter 133, may be input to a column driver.

The ramp voltage generator 131 may be configured to generate a ramp signal RMP in response to a ramp enable signal. The ramp signal RMP is a signal whose voltage is increased or decreased in proportion to time.

The sampling circuit 132 may obtain a reset voltage and a pixel voltage from a portion of pixels, connected to a row line scanned by the selection circuit 120 (SC1~SCi), among the plurality of pixels $PX_{11}$ to $PX_{MN}$. The sampling circuit 132 may include a plurality of samplers SA, and each of the plurality of samplers SA may be a correlated double sampler. Each of the plurality of samplers SA may receive the ramp signal RMP of the ramp voltage generator 131 through a first input terminal, and may receive the reset voltage/the pixel voltage from the plurality of pixels $PX_{11}$ to $PX_{MN}$ through a second input terminal.

The analog-to-digital converter 133 may convert an analog signal of the sampling circuit 132 into a digital signal to output pixel data.

The image sensor 100 may be implemented as a two-stack structure. As an example, a pixel array and peripheral circuits (a low decoder, a CDS, and an ADC) may be disposed on a first layer, and logic circuits (a power supply circuit, an I/O interface, an ISP, and the like) may be configured on a second layer. As another example, only a pixel array may be disposed on the first layer, and peripheral circuits and logic circuits may be disposed on the second layer.

Figure 3:
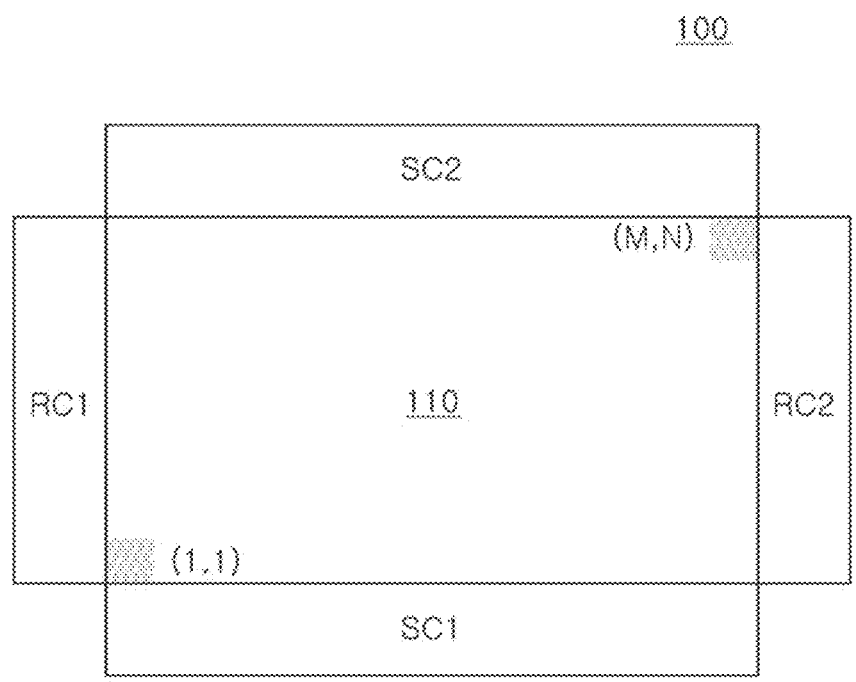
FIG. 3 illustrates an arrangement of selection circuits and readout circuits of the image sensor, according to an example embodiment.

FIG. 3 illustrates an arrangement of selection circuits and readout circuits of the image sensor 100 with respect to the pixel array 110, according to an example embodiment. It is noted that some components of the image sensor 100 are omitted in FIG. 3 for conciseness. Referring to FIG. 3, a first readout circuit RC1 may be disposed on a left side of a pixel array 110 and a second readout circuit RC2 may be on a right side of the pixel array 110.

A first selection circuit SC1 may be disposed below the pixel array 110, and a second selection circuit SC2 may be disposed above the pixel array 110. The first selection circuit SC1 may select pixels of the pixel array 110 in a first direction, and the second selection circuit SC2 may select pixels of the pixel array 110 in a second direction. The second direction may be different from the first direction. For example, the first direction may be a left-to-right direction, and the second direction may be a right-to-left direction. However, it will be understood that the directions, in which pixels are selected, are not limited thereto.

In the image sensor 100 according to the example embodiment illustrated in FIG. 3, the first and second selection circuits SC1 and SC2 and the first and second readout circuits RC1 and RC2 may be variously enabled or disabled to output first and second frames corresponding to two scanning operations.

Figure 4A:
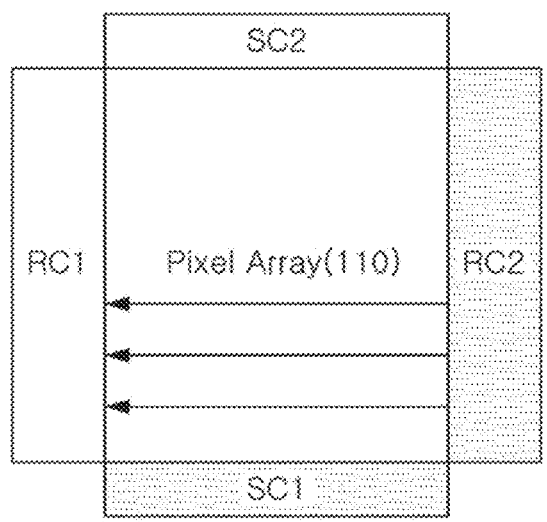
FIG. 4A illustrates a process of outputting a first frame depending on a first scanning operation.
Figure 4B:
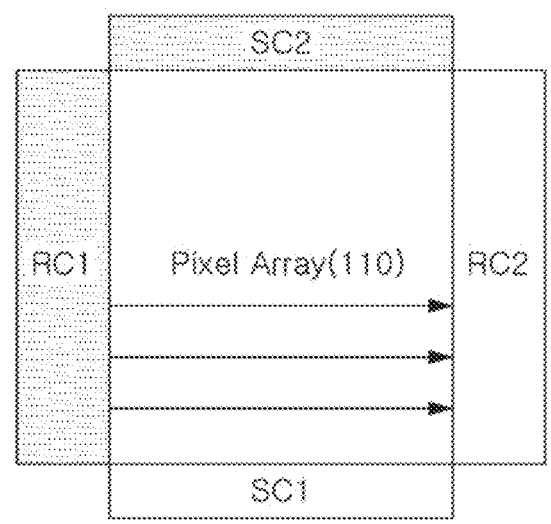
FIG. 4B illustrates a process of outputting a second frame depending on a second scanning operation following the first scanning operation, according to example embodiments.

FIG. 4A illustrates a process of outputting a first frame depending on a first scanning operation, and FIG. 4B illustrates a process of outputting a second frame depending on a second scanning operation following the first scanning operation.

Referring to FIG. 4A, the first scanning operation may be performed by the enabled first selection circuit SC1 (indicated by shading in FIG. 4A) and the enabled second readout circuit RC2 (indicated by shading in FIG. 4A). In the first scanning operation, the second selection circuit SC2 and the first readout circuit RC1 may be disabled. The first selection circuit SC1 and the second readout circuit RC2 may scan columns in a right-to-left direction, and the second readout circuit RC2 may outputs a first frame corresponding to a scanning result.

Referring to FIG. 4B, following the first scanning operation, the second scanning operation may be performed by the enabled second selection circuit SC2 (indicated by shading in FIG. 4B) and the enabled first readout circuit RC1 (indicated by shading in FIG. 4B). In the second scanning operation, the first selection circuit SC1 and the second readout circuit RC2 may be disabled. The second selection circuit SC2 and the first readout circuit RC1 may scan columns in a left-to-right direction, and the first readout circuit may output a second frame corresponding to a scanning result.

In FIGS. 4A and 4B, the first and second scanning operations are performed at different timings to each other. However, the present disclosure is not limited thereto. In the present disclosure, the first and second scanning operations may be performed simultaneously.

FIGS. 5A, 5B, 5C, and 5D illustrate first and second scanning operations performed simultaneously, according to various example embodiments.

Figure 5A:
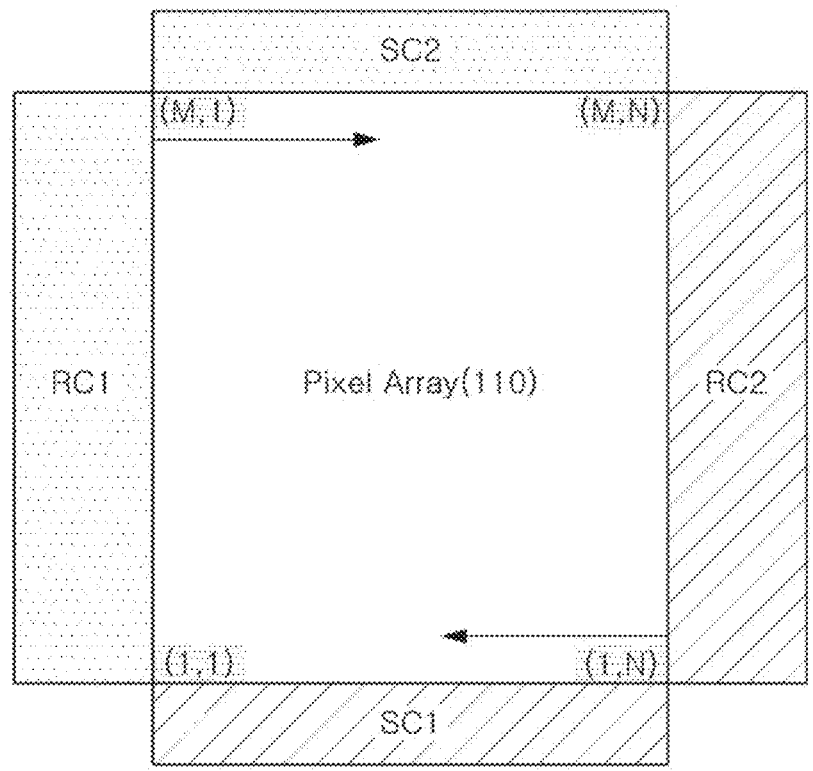
FIGS. 5A, 5B, 5C, and 5D illustrate first and second scanning operations performed simultaneously, according to example embodiments.

Referring to FIG. 5A, a first scanning operation may start from a lower right portion (1,N) and a second scanning operation may start from an upper left portion (M,1). In this case, the first scanning operation may be performed from bottom row to a top row, and the second scanning operation may be performed from the top row to the bottom row. In some example embodiments, the first scanning operation may be performed by the second selection circuit SC2 and the first readout circuit RC1, and the second scanning operation may be performed by the first selection circuit SC1 and the second readout circuit RC2. However, it should be understood that the first and second scanning operations are not limited thereto.

Figure 5B:
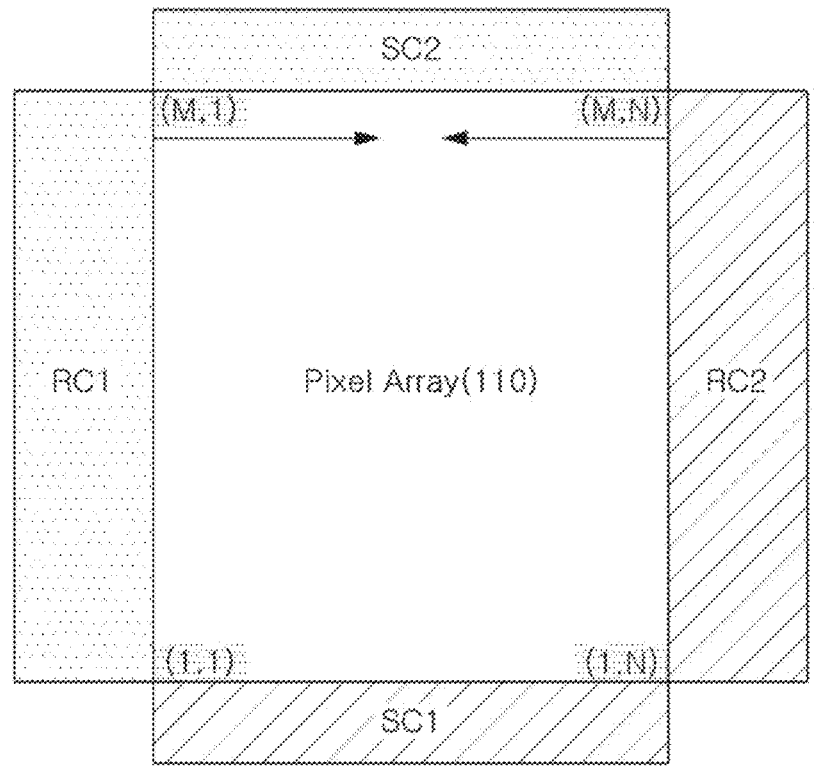

Referring to FIG. 5B, a first scanning operation may start from an upper left portion (M,1), and a second scanning operation may start from an upper right portion (M,N). Each of the first and second scanning operations may be performed from a top row to a bottom row.

Figure 5C:
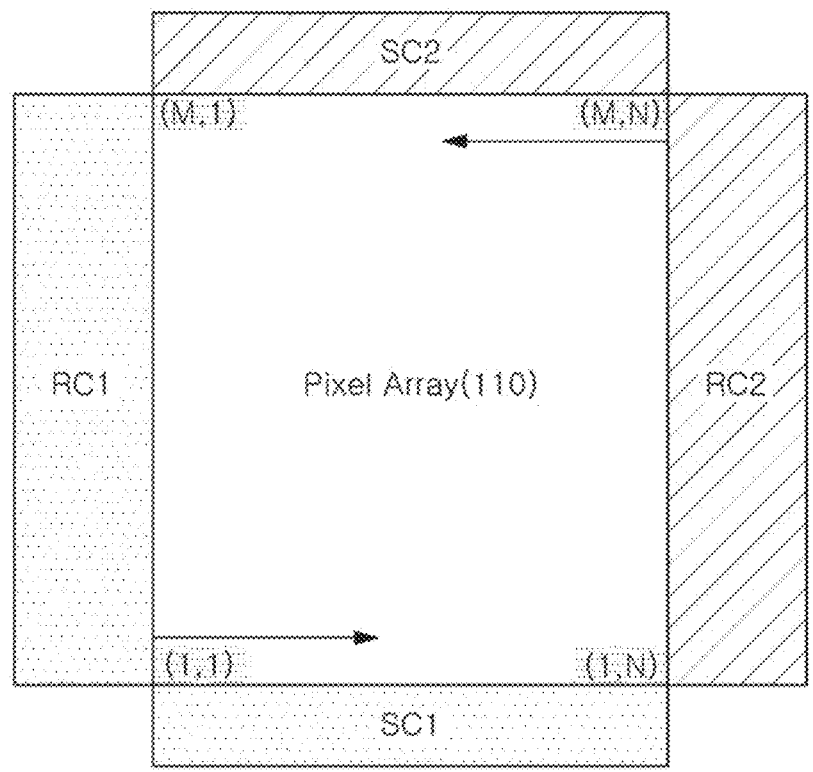

Referring to FIG. 5C, the first scanning operation may start from a lower left portion (1,1), and the second scanning operation may start from an upper right portion (M,N). In this case, the first scanning operation may be performed from a bottom row to a top row, and the second scanning operation may be performed from an top row to a bottom row. In some example embodiments, the first scanning operation may be performed by the first selection circuit SC1 and the first readout circuit RC1, and the second scanning operation is performed by the second selection circuit SC2 and the second readout circuit RC2. However, it will be understood that the first and second scanning operations are not limited thereto.

Figure 5D:
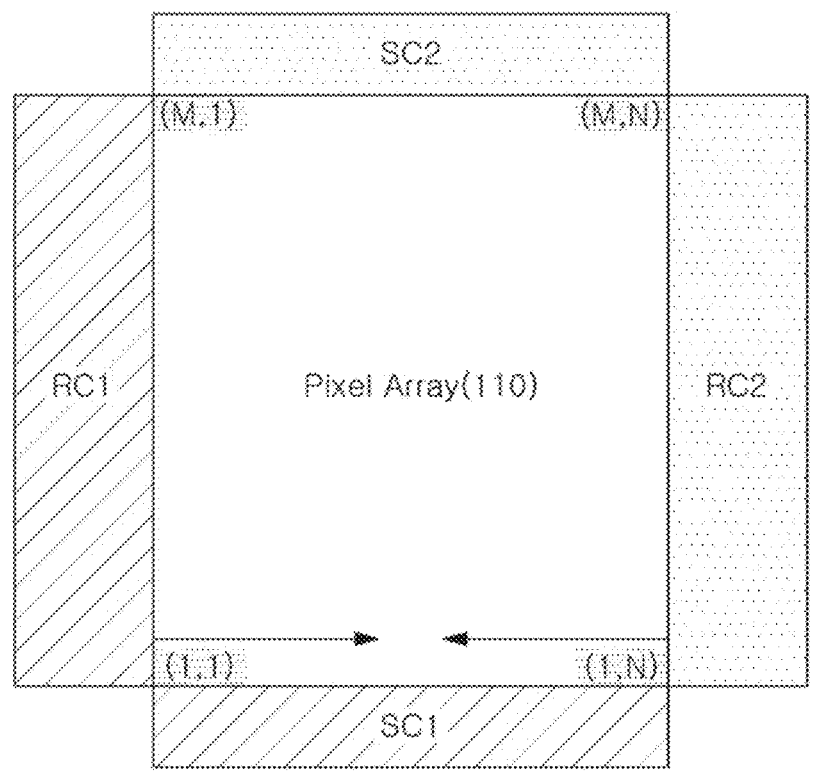

Referring to FIG. 5D, the first scanning operation may start from a lower left portion (1,1) and the second scanning operation may start from a lower right portion (1,N). Each of the first and second scanning operations may be performed from a low row to a high row.

It should be understood that the simultaneously performed scanning operations illustrated in FIGS. 5A, 5B, 5C, and 5D are only exemplary.

Figure 6A:
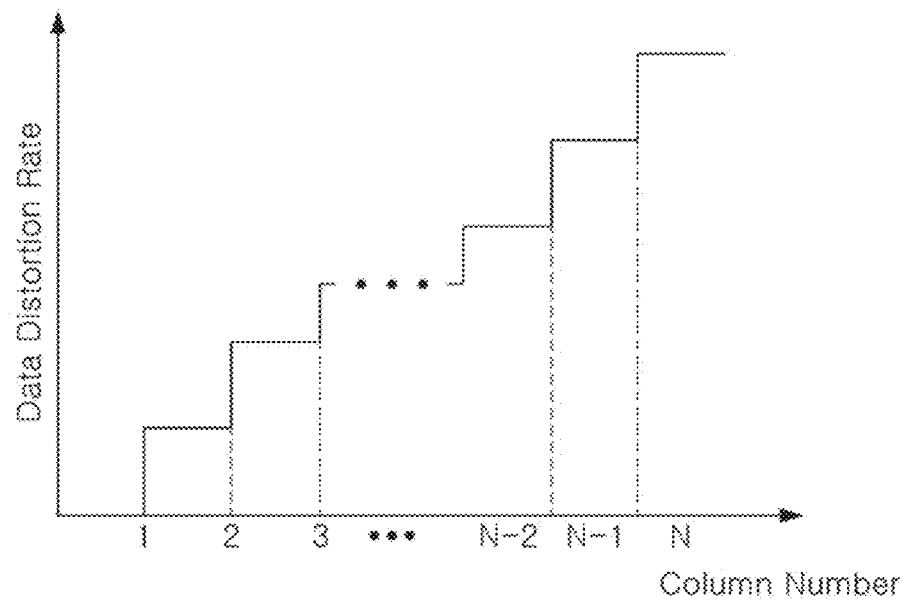
FIGS. 6A, 6B, and 6C illustrate a process of reducing data distortion in the imaging device, according to an example embodiment.
Figure 6B:
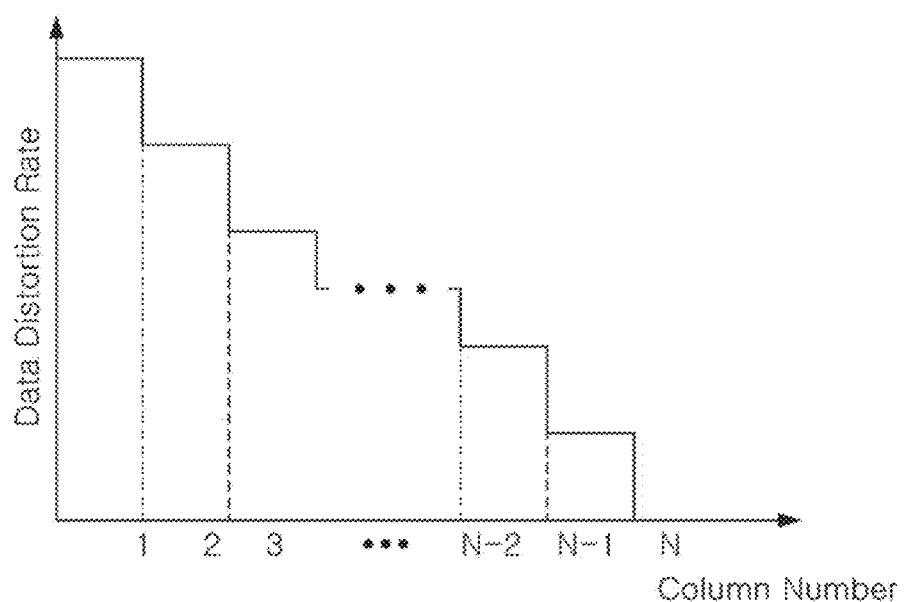
Figure 6C:
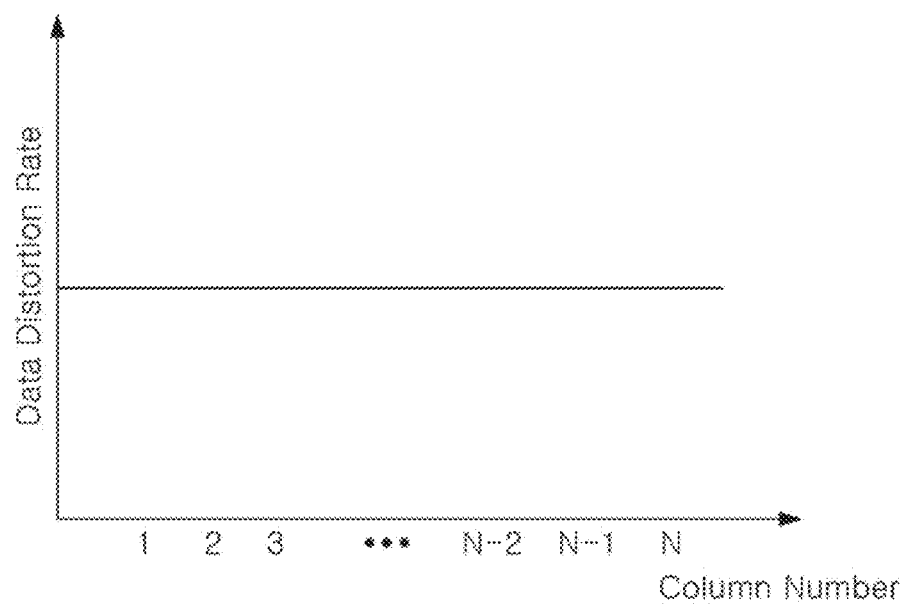

FIGS. 6A, 6B, and 6C illustrate a process of reducing data distortion in the imaging device according to an example embodiment.

Referring to FIG. 6A, a data distortion rate for a first scanning operation increases as the column number increases. The closer a column is to the first selection circuit (for example, SC1), the lower the data distortion rate. By contrast, the farther a column is from the first selection circuit SC1, the higher the data distortion rate.

Referring to FIG. 6B, a data distortion rate for a second scanning operation decreases as the column number increases. The closer a column is to the second selection circuit (for example, SC2), the higher the data distortion rate. By contrast, the farther a column is from the second selection circuit SC2, the lower the data distortion rate.

Referring to FIG. 6C, a first frame, a result of the first scanning operation, and a second frame, a result of the second scanning operation, may be merged, so that a data distortion rate for a frame of the imaging device 10 may have a constant value, irrespective of a column number. For example, the imaging device 10 according to the present disclosure may maintain a constant data distortion rate, irrespective of a distance from a selection circuit. In other words, the imaging device 10 according to the present disclosure may reduce a data distortion variation between column lines.

Due to a deviation between readout circuits during frame readout, fixed pattern noise (FPN) may be generated even when a black screen is captured. In the imaging device 10 according to an example embodiment, since first and second frames are configured through different readout circuits, the first and second frames exhibit different FPN forms and are averaged. As a result, an average error value obtained by FPN between all columns is the same, and a standard deviation may be decreased.

Figure 7A:
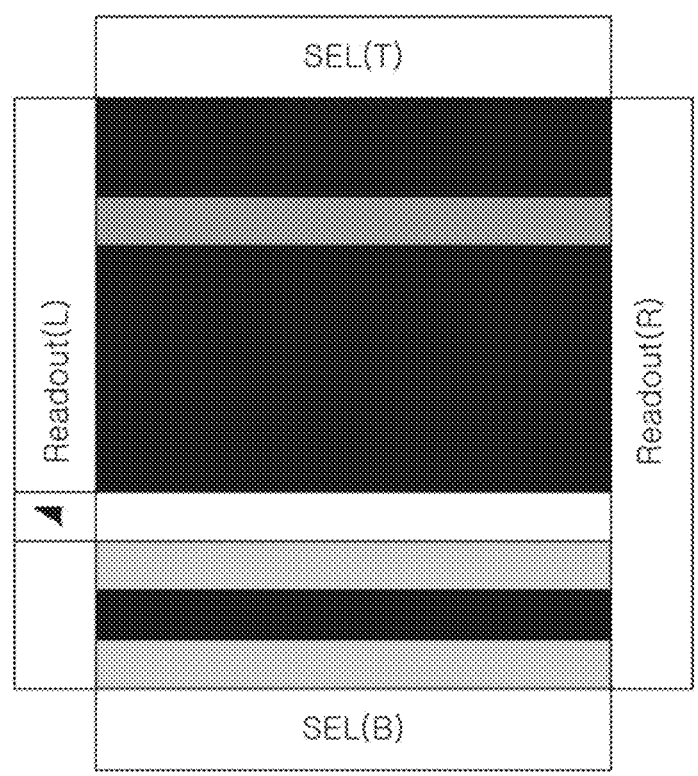
FIGS. 7A, 7B, and 7C illustrate a process of attenuating fixed pattern noise (FPN) in the imaging device, according to an example embodiment.
Figure 7B:
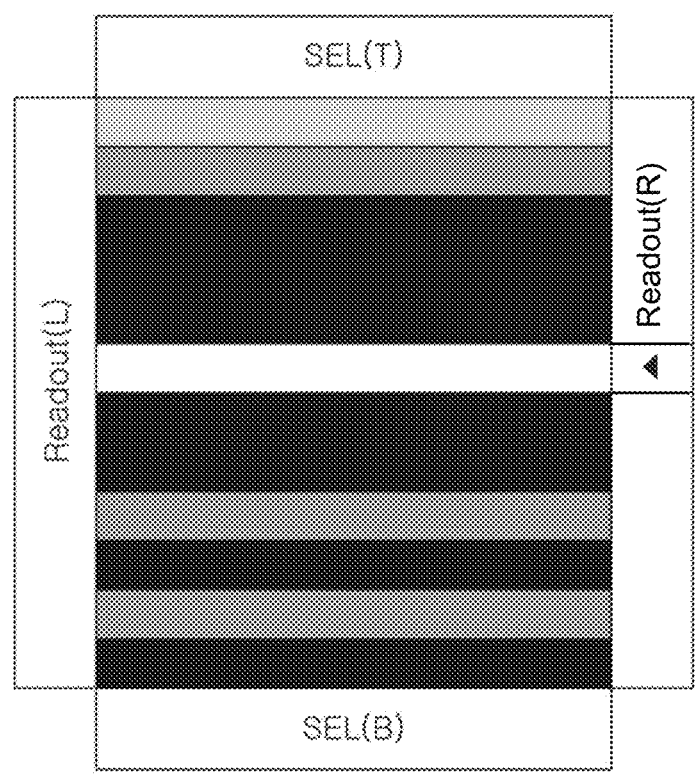
Figure 7C:
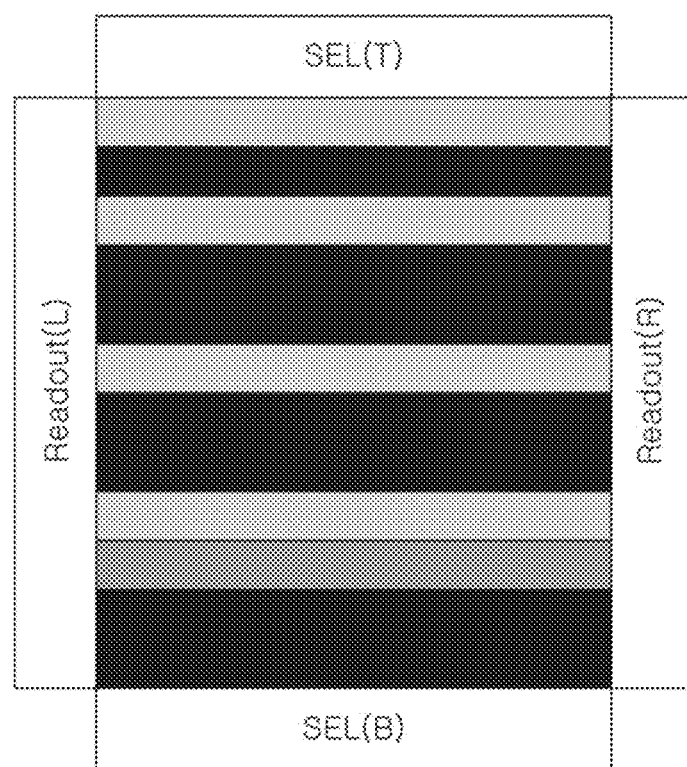

FIGS. 7A, 7B, and 7C illustrate a process of attenuating fixed pattern noise (FPN) in the imaging device 10 according to an example embodiment.

FIG. 7A illustrates FPN of a first frame caused by a left readout circuit, FIG. 7B illustrates FPN of a second frame caused by a right readout circuit, and FIG. 7C illustrates FPN of average frames of the first and second frames. As can be seen from FIG. 7C, the FPN of the average frame is attenuated, as compared with the FPN of the first frame and the FPN of the second frame.

Figure 8:
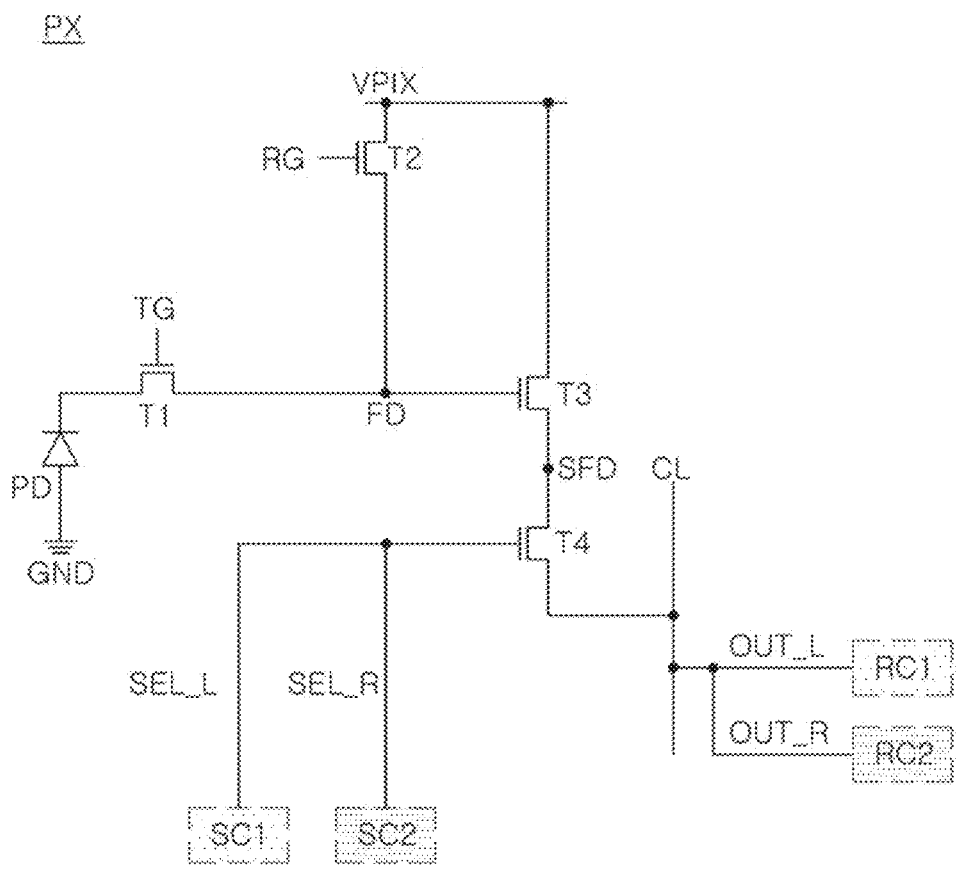
FIG. 8 illustrates a pixel according to an example embodiment.

FIG. 8 illustrates a pixel PX according to an example embodiment. Referring to FIG. 8, the pixel PX may include a photodiode FD and a first transistor T1, a second transistor T2, a third transistor T3, and a fourth transistor T4.

The first transistor T1 may be connected between a floating diffusion node FD and the photodiode PD in response to a transfer gating signal TG. The second transistor T2 may be connected between a power supply terminal VPIX, providing a pixel driving voltage, and the floating diffusion node FD in response to a reset gating signal RG. The third transistor T3 may have a drain connected to the power supply terminal VPIX, and a gate connected to the floating diffusion node FD. The fourth transistor T4 may be connected between a source SFD of the third transistor T3 and a column line CL in response to one of a first selection signal SEL_L and a second selection signal SEL_R. The column line CL may be connected to two readout circuits RC1 and RC2. An output voltage OUT_L or OUT_R may be transmitted to an enabled one of the readout circuits RC1 and RC2. For example, the first output voltage OUT_L, output in response to the first selection signal SEL_L, may be transmitted to the first readout circuit RC1. The second output voltage OUT_R, output in response to the second selection signal SEL_R, may be transmitted to the second readout circuit RC2.

It will be understood that readout circuits of the present disclosure, to which output voltages are transmitted, are not limited thereto.

The pixel illustrated in FIG. 8 operates in different passes determined by the two selection circuits SC1 and SC2 and the two readout circuits RC1 and RC2. However, in some example embodiments, a pixel of the present disclosure may operate in different passes determined by at least three selection circuits and at least three readout circuits.

The pixel illustrated in FIG. 8 includes four transistors T1 to T4. However, it will be understood that a structure of the pixel of the present disclosure is not limited thereto.

Figure 9:
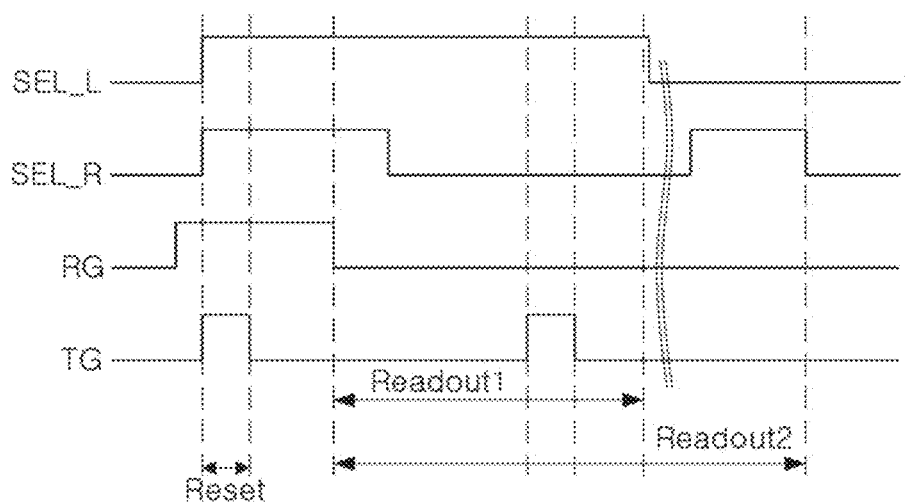
FIG. 9 is an operational timing diagram of the pixel in FIG. 8, according to an example embodiment.

FIG. 9 is an operational timing diagram of the pixel in FIG. 8, according to an example embodiment. In a reset mode, the reset gating signal RG, the transfer gating signal TG, and the first and second selection signals SEL1 and SEL2 may be enabled to turn on a reset transistor T2 (see FIG. 8) or the transfer transistor T1 (see FIG. 8). Accordingly, a pixel drive voltage may be provided to the floating diffusion node FD, and charges of the photodiode PD and the floating diffusion node FD may be initialized. Then, photocharges may be generated and accumulated in the photodiode PD until the transfer transistor T1 is turned on after being turned off (for example, for a photoelectric transformation time).

Then, a reference signal may be output by disabling the reset gating signal RG and detecting a reset potential on the floating diffusion node FD. In this case, the first selection signal SEL_L may be maintained in an active state, and the second selection signal SEL_R may be disabled.

After the reference signal is output, a transfer gating signal TG may be enabled. Thus, the photocharges accumulated in the photodiode PD may be transferred to the floating diffusion node FD. After the enabled transfer gating signal TG is disabled again, the potential on the floating diffusion node FD may be detected to output a first pixel signal depending on the first pass corresponding to the first selection signal SEL_L. In example embodiments, the first selection signal SEL_L may be enabled until a first readout period in which a first pixel signal is output ends.

After the first pixel signal is output, the first selection signal SEL_L may be disabled, and the second selection signal SEL_R may be enabled for a certain period of time. Accordingly, the potential on the floating diffusion node FD may be detected to output a second pixel signal depending on the second pass corresponding to the second selection signal SEL_R. In example embodiments, the second selection signal SEL_R may be enabled until a second readout period Readout2 in which the second pixel signal is output ends.

The pixel according to an example embodiment may be implemented with a 2-PD structure.

Figure 10:
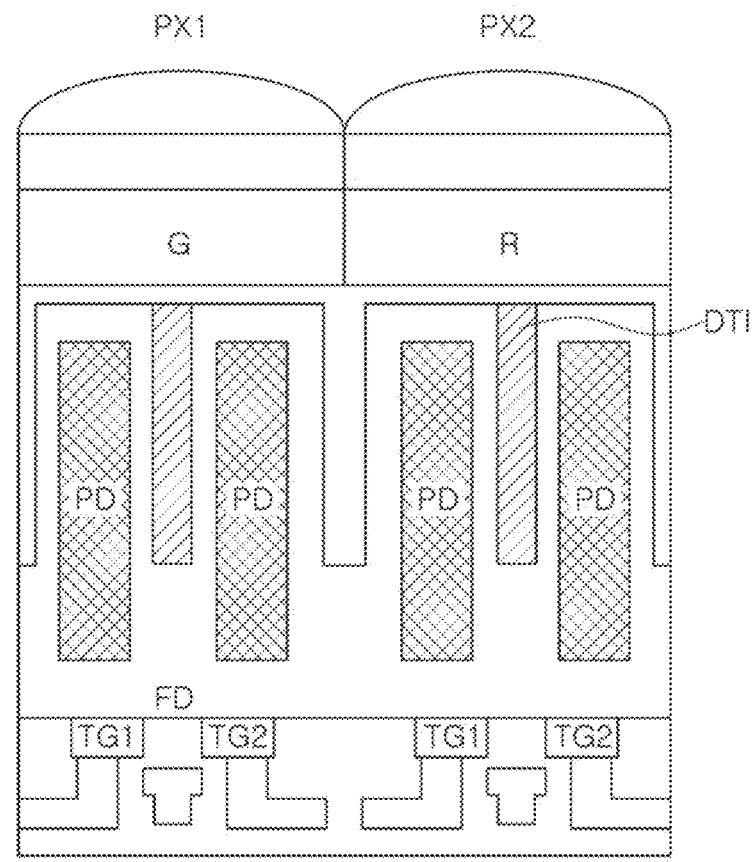
FIG. 10 illustrates a pixel having a 2-PD structure according to an example embodiment.

FIG. 10 illustrates a pixel having a 2-PD structure according to an example embodiment. Referring to FIG. 10, in the 2-PD structure, a left photodiode and a right photodiode may be separated from each other by In-Pixel Deep Trench Isolation (DTI).

A region corresponding to the floating diffusion node FD may be commonly connected to a pair of left and right photodiodes disposed in a pixel. For example, a floating diffusion region may be commonly connected to four photoelectric transformation elements. For example, the floating diffusion region may include N-type impurities. First and second transfer gates TG1 and TG2, disposed on a substrate of a first pixel PX1, and first and second transfer gates TG1 and TG2, disposed on a substrate of a second pixel PX2, may share the floating diffusion region FD. In FIG. 10, the first pixel PX1 may include a green filter G, and the second pixel PX2 may include a red filter R. Each of the first pixel PX1 and the second pixel PX2 may include an optical lens for focusing light.

The present disclosure may be applied to a dynamic vision sensor (DVS) pixel. A DVS is a specialized sensor configured to detect the degree of change in light at the level of an individual pixel. The DVS does not output an event when the change in light is below a reference value, and generates an ON event when the light becomes brighter than a reference value and an OFF even when the light becomes dark. Since a DVS detects a change in light without charge integration in a pixel to directly output an event, the DVS may output an event to an external entity without a time delay through asynchronous handshaking communication depending on a design, or may store a generated even and then output the event to an external entity when a synchronous readout signal is input. In addition, since the DVS has a property of converting photocurrent to a log scale, the DVS may respond to the same rate of change in light, irrespective of illuminance, to have a wide dynamic range.

Figure 11:
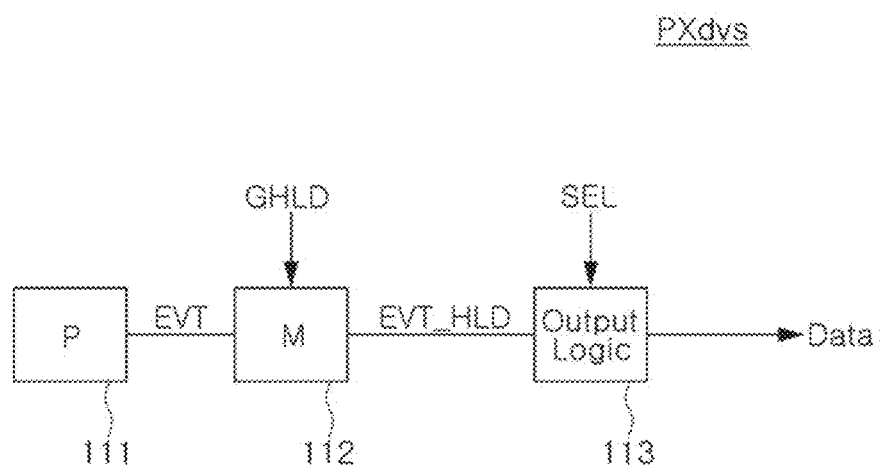
FIG. 11 is a conceptual diagram of a dynamic vision sensor (DVS) pixel according to an example embodiment.

FIG. 11 is a conceptual diagram of a DVS pixel PXdvs according to an example embodiment. Referring to FIG. 11, the DVS pixel PXdvs may include an event detection circuit (P) 111, an event storage circuit (M) 112, and an output logic 113.

The event detection circuit 111 may determine whether an event occurs using the charge collected by a photodiode and may output pixel data EVT corresponding to a determination result. The pixel data EVT may include data on an ON or OFF event through a pixel for a pixel exposure time. The pixel exposure time may be predetermined.

The event storage circuit 112 may hold the pixel data EVT in response to a holding signal GHLD. For example, when the holding signal GHLD is turned off, the pixel data EVT may start to be held. The pixel data EVT may be held in a capacitor until a single frame is finished. After a pixel exposure time elapses, data may be held in the capacitor during a pixel read operation.

The output logic 113 may receive hold data EVT_HLD of the event storage circuit 112 in response to the selection signal SEL, and may output corresponding data.

Figure 12:
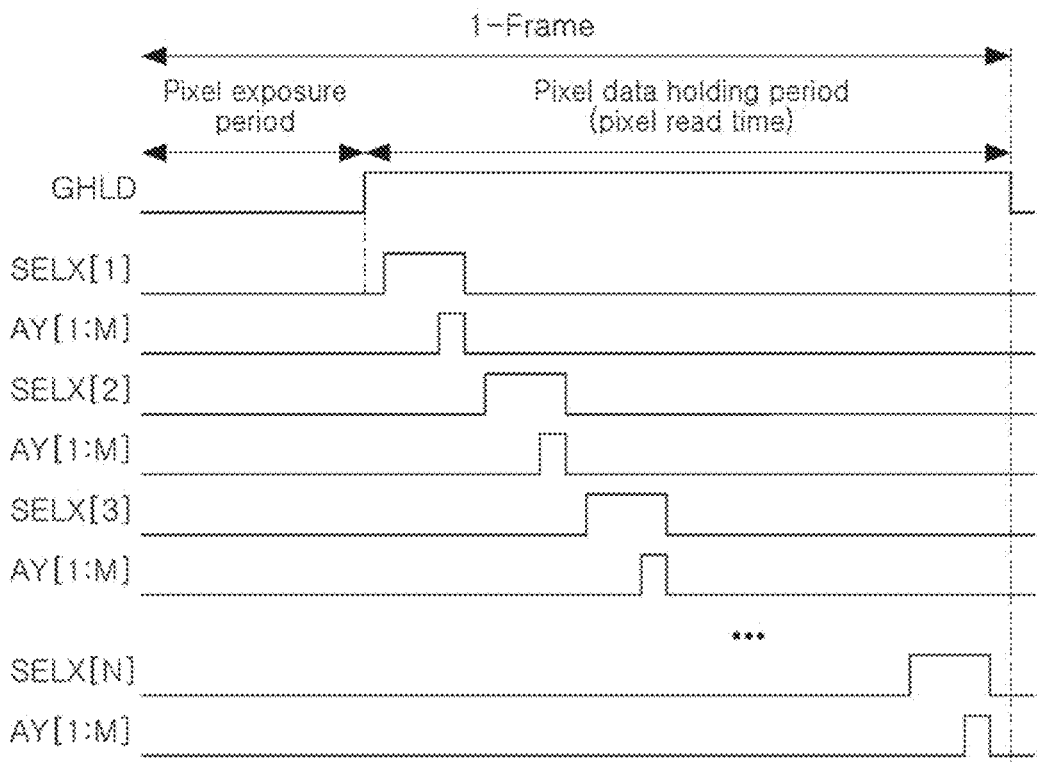
FIG. 12 is an operational timing diagram of the DVS pixel in FIG. 11, according to an example embodiment.

FIG. 12 is an operational timing diagram of the DVS pixel in FIG. 11, according to an example embodiment. Hereinafter, an operation of the DVS pixel PXdvs will be described with reference to FIGS. 11 and 12.

During a pixel exposure period, the DVS pixel PXdvs may detect an event. In the pixel exposure period, a holding signal GHLD has a low level.

During a pixel data holding period, the holding signal GHLD has a high level. Pixel data may be output to AY[1:M] for all rows, present in a corresponding column, in response to a first selection signal SELK[1] output from the first selection circuit SC1. Then, pixel data may be output to AY[1:M] for all rows, present in a corresponding column, in response to a second selection signal SELK[2] output from the second selection circuit SC2. In the same manner, pixel data may be output to AY[1:M] for all rows, present in a corresponding column, in response to an n-th selection signal SELK[N]. Then, the above-described operation may be performed on the next frame.

Figure 13:
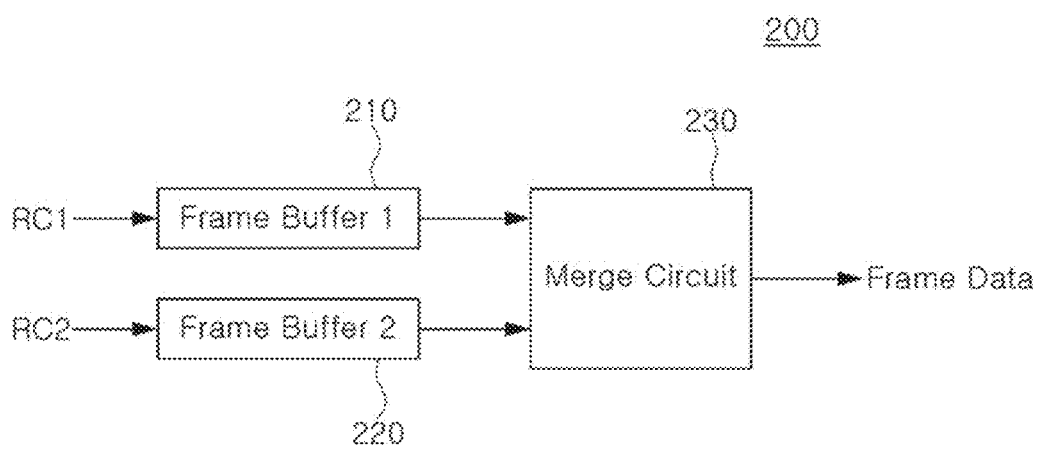
FIG. 13 illustrates an image signal processor according to an example embodiment.

FIG. 13 illustrates an image signal processor 200 according to an example embodiment. Referring to FIG. 13, the image signal processor 200 may include a first frame buffer 210, a second frame buffer 220, and a merge circuit 230.

The first frame buffer 210 may receive a first frame from a first readout circuit RC1, and may store the received first frame.

The second frame buffer 220 may receive a second frame from a second readout circuit RC2, and may store the received second frame.

The merge circuit 230 may receive a first frame of a first frame buffer 210 and a second frame of a second frame buffer 220, and may perform an operation on the first frame and the second frame to generate frame data. The operation may be predetermined. The operation may include an averaging operation. However, it will be understood that the operation of the present disclosure is not limited thereto.

Figure 14:
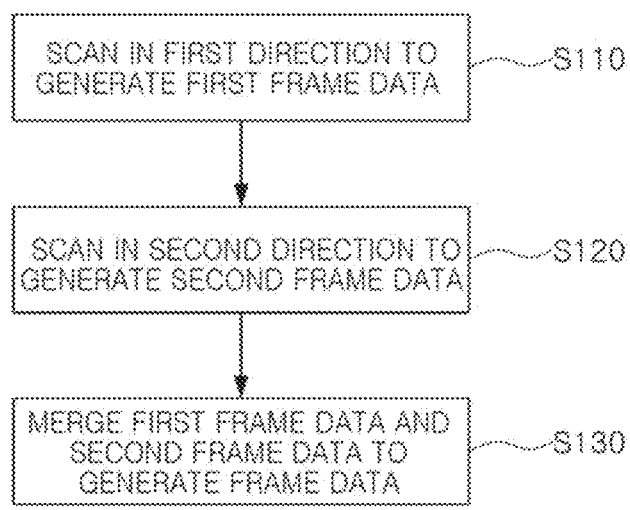
FIG. 14 is a flowchart illustrating a method of operating an imaging device, according to an example embodiment.

FIG. 14 is a flowchart illustrating a method of operating an imaging device 10 according to an example embodiment. Hereinafter, an operation of the imaging device 10 will be described with reference to FIGS. 1 to 14.

The image sensor 100 of the imaging device 10 may scan in a first direction to generate first frame data (S110). For example, the image sensor 100 of the imaging device 10 may perform a first scanning operation in a first direction. The first frame data may be output as a result of the first scanning operation. In example embodiments, the first frame data may be output to the image signal processor 200 by a first path corresponding to the first scanning operation.

The image sensor 100 may scan in a second direction to generate second frame data (S120). For example, the image sensor 100 of the imaging device 10 may perform a second scanning operation in the second direction. The second direction may be different from the first direction. The second frame data may be output as a result of the second scanning operation. In example embodiments, the first frame data may be output to the image signal processor 200 by a second path corresponding to the second scanning operation. In some example embodiments, the second scanning operation may be performed simultaneously with the first scanning operation. In other example embodiments, the second scanning operation may be performed following the first scanning operation.

The image signal processor 200 may merge the first frame data and the second frame data to generate frame data (S130).

The imaging device described with reference to FIGS. 1 to 14 includes at least two readout circuits. However, the present disclosure is not necessarily limited thereto. The imaging device according to the present disclosure may be implemented as a single readout circuit.

Figure 15:
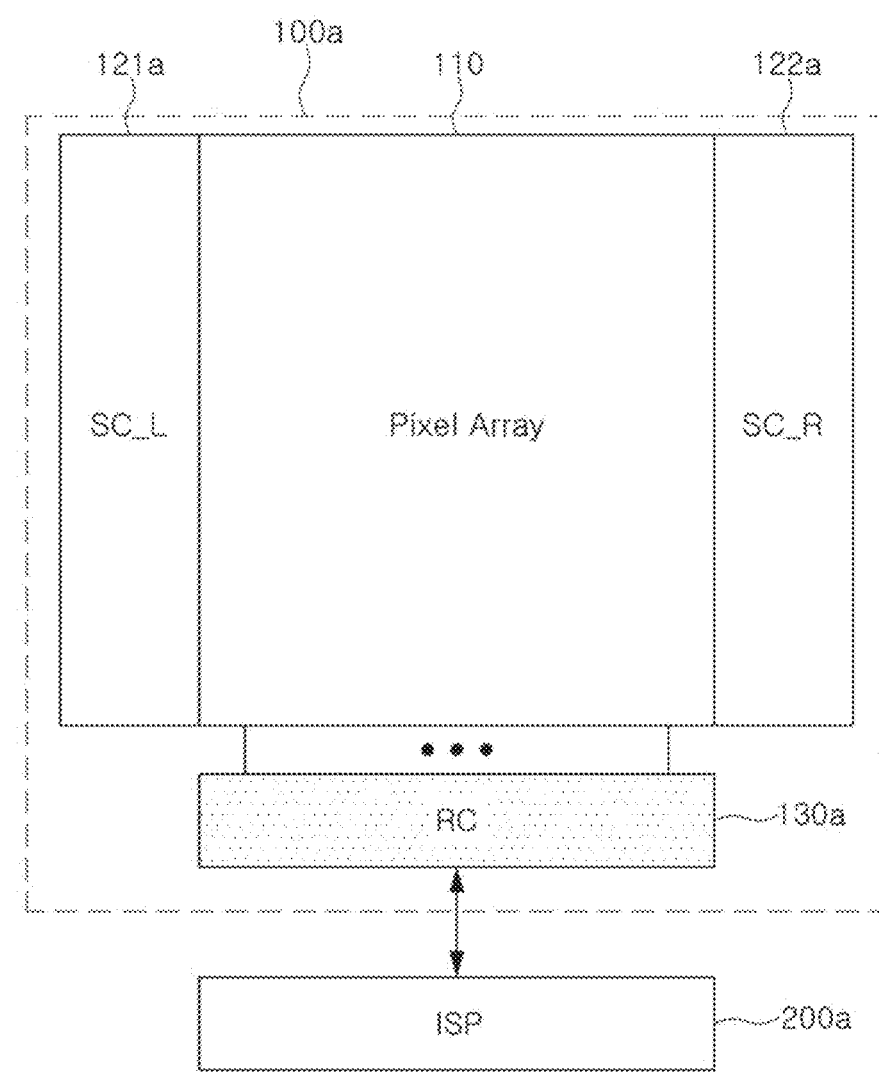
FIG. 15 illustrates an imaging device according to another example embodiment.

FIG. 15 illustrates an imaging device 20 according to another example embodiment. Referring to FIG. 15, the imaging device 20 may include an image sensor 100a and an image signal processor 200a. The image sensor 100a may be implemented with two selection circuits (SC_L and SC_R) 121a and 122a and one readout circuit RC 130a, as compared with the image sensor 100 described above. Each of the selection circuits SC_L and SC_R and the readout circuit RC may perform a scanning operation on the pixel array 110 in different directions. For example, the first selection circuit SC_L and the readout circuit RC may perform a first scanning operation on the pixel array 110 in the first direction, and the second selection circuit SC_R and the readout circuit RC may perform a second scanning operation on the pixel array 110 in the second direction. Since the scanning operation is performed by one readout circuit RC, the second scanning operation may be performed following the first scanning operation, or the first scanning operation may be performed following the second scanning operation. The operation of the image signal processor 200a is similar to that of the image processor 200, and therefore a repeated description thereof is omitted for conciseness.

Figure 16:
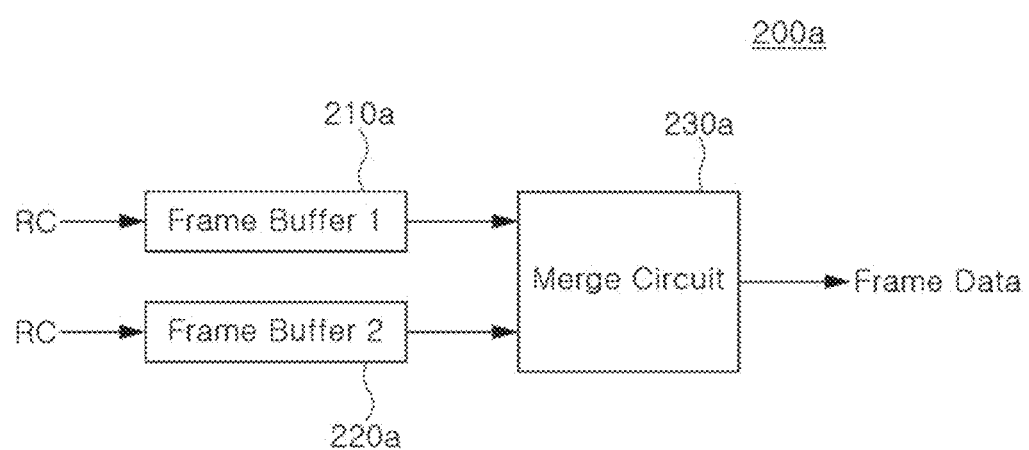
FIG. 16 illustrates an image signal processor of the imaging device of FIG. 12, according to an example embodiment.

FIG. 16 illustrates the image signal processor 200a in FIG. 12, according to an example embodiment. Referring to FIG. 16, the image signal processor 200a may include a first frame buffer 210a, a second frame buffer 220a, and a merge circuit 230a. Both the first frame buffer 210a and the second frame buffer 220a may receive corresponding frame data from the readout circuit RC. For example, the first frame data from the first scanning operation may be stored in the first frame buffer 210a, and the second frame data from the second scanning operation may be stored in the second frame buffer 220a, and then merged by the merge circuit 230a.

Figure 17:
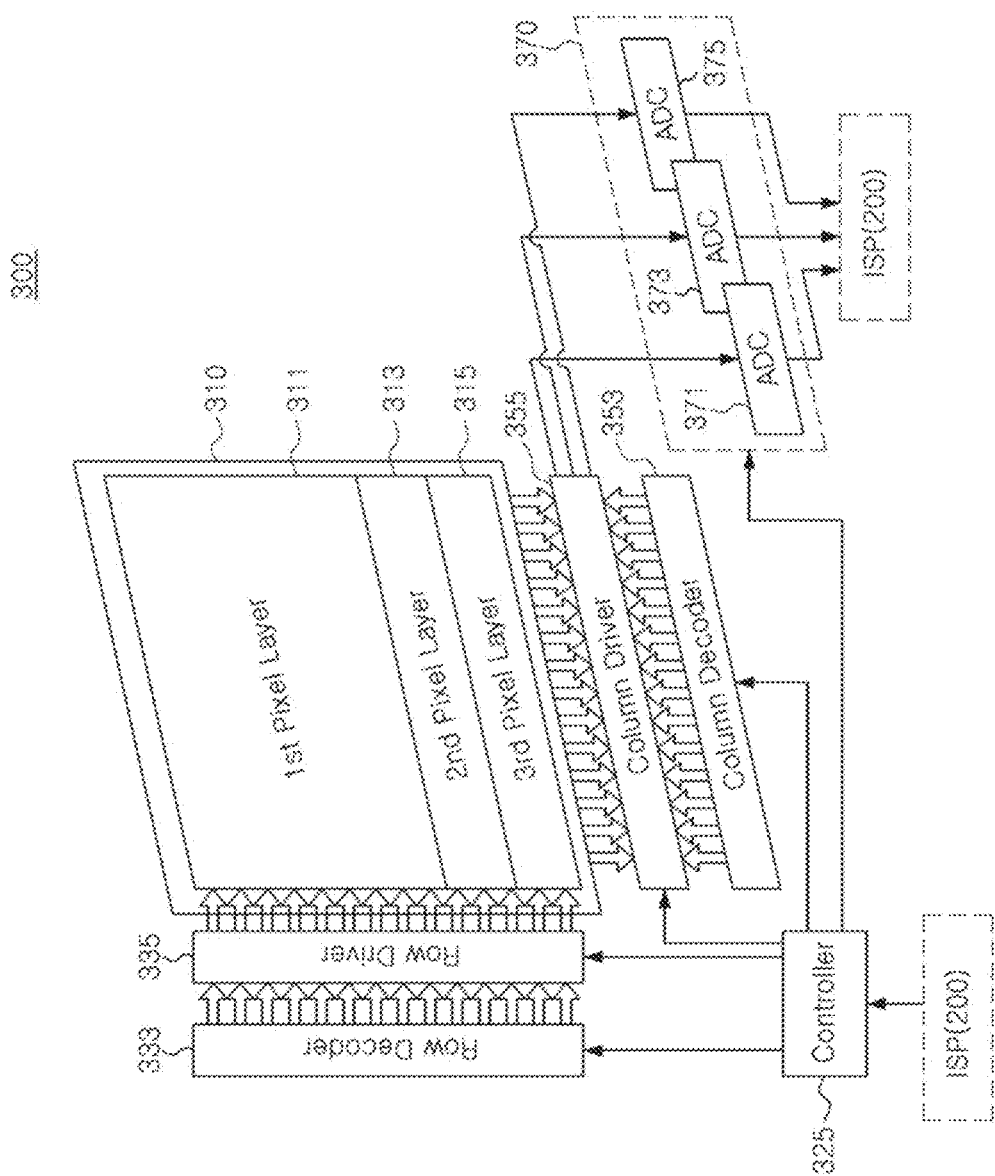
FIG. 17 illustrates an imaging sensor according to another example embodiment.

FIG. 17 illustrates an imaging sensor 300 according to another example embodiment. Referring to FIG. 17, the image sensor 300 may include a pixel array 310, a controller 325, a row decoder 333, a row driver 335, a column decoder 353, a column driver 355, and an ADC 370.

The pixel array 310 may detect light, reflected from a subject, to generate target information of the subject and/or image information of the subject. The pixel array 310 may include a plurality of pixels arranged in a two-dimensional matrix. The pixel array 310 may include a plurality of pixel layers 311, 313, and 315.

In example embodiments, at least one of the plurality of pixel layers 311, 313, and 315 may be a DVS pixel array.

In some example embodiments, the first pixel array 311 may be a color pixel array (CPA). For example, a color pixel array may include Bayer-pattern pixels. In some example embodiments, the second pixel array 313 may be a depth pixel array (DPA). For example, the depth pixel array may include a plurality of 2-PD pixels or a plurality of metal shield pixels. In some example embodiments, the second pixel array 313 may include at least one temperature sensor for performing temperature-dependent depth correction. In some example embodiments, the third pixel array 215 may be a thermal pixel array (TPA). For example, a thermal pixel array may include a plurality of temperature pixels.

It will be understood that the number of pixel arrays of the present disclosure is not limited thereto. The pixel array according to various example embodiments may include at least two pixel layers for performing different functions to each other.

The controller 325 may generate control signal(s) to control an operation of each of the row decoder 333, the row driver 335, the column decoder 353, the column driver 355, and a plurality of ADCs 371, 373, and 375. For example, the controller 325 may generate a plurality of row control signals to select a specific row line among a plurality of row lines included in each of a plurality of stacked pixel layers 311, 313, and 315. In example embodiments, the controller 325 may be disposed on a layer different from a layer on which the pixel array 310 is disposed. The controller 325 may be a hardware logic circuit that provides the control signals, or may be a microprocessor that executes software stored in a memory to provide the control signals.

The row decoder 333 may decode a plurality of row control signals output from the controller 325, for example, row address signals, and may output a plurality of row selection signals depending on a decoding result. The row driver 335 may drive at least one of the plurality of rows, included in each of the plurality of pixel layers 311, 313, and 315, in response to each of the plurality of row selection signals output from the row decoder 333.

The column decoder 353 may decode a plurality of column control signals output from the controller 325, for example, column address signals, and may output a plurality of column selection signals depending on a decoding result. The column driver 355 may drive each of the plurality of column lines, included in each of the plurality of pixel layers 311, 313 and 315, in response to each of the plurality of column selection signals output from the column decoder 353.

The image sensor 300 illustrated in FIG. 17 includes a single row driver 335 and a single column driver 355. However, example embodiments are not limited thereto and, in some example embodiments, the image sensor 300 may include a plurality of row drivers or a plurality of column drivers for driving row lines or column lines of each of the plurality of pixel layers 311, 313, and 315. Among the plurality of row drivers, at least two row drivers may perform selection operations in different directions. In addition, among the plurality of column drivers, at least two column drivers may perform selection operations in different directions. The image sensor 300 may include a plurality of row decoders or a plurality of column decoders.

Each of the plurality of ADCs 371, 373, and 375 may convert signals, respectively output from the plurality of layers 311, 313, and 315, into analog-to-digital signals and may output the analog-to-digital signals to the ISP 200 as image data. For example, the image data may include target information or image information.

According to example embodiments, each of the plurality of ADCs 371, 373, and 375 may further include a correlated double sampling (CDS) circuit that performs correlated double sampling on signals, respectively output from the plurality of pixel layers 311, 313, and 315. In this case, each of the plurality of ADCs 371, 373, and 375 may compare a correlated-double-sampled signal with a ramp signal, and may output a comparison result as image data.

The image signal processor (ISP) 200 may process the image data such that the image data is displayed. In addition, the image signal processor 200 may perform an operation on frame data, obtained by scanning the same frame in different directions as described in FIGS. 1 to 16, to generate optimized frame data.

Figure 18:
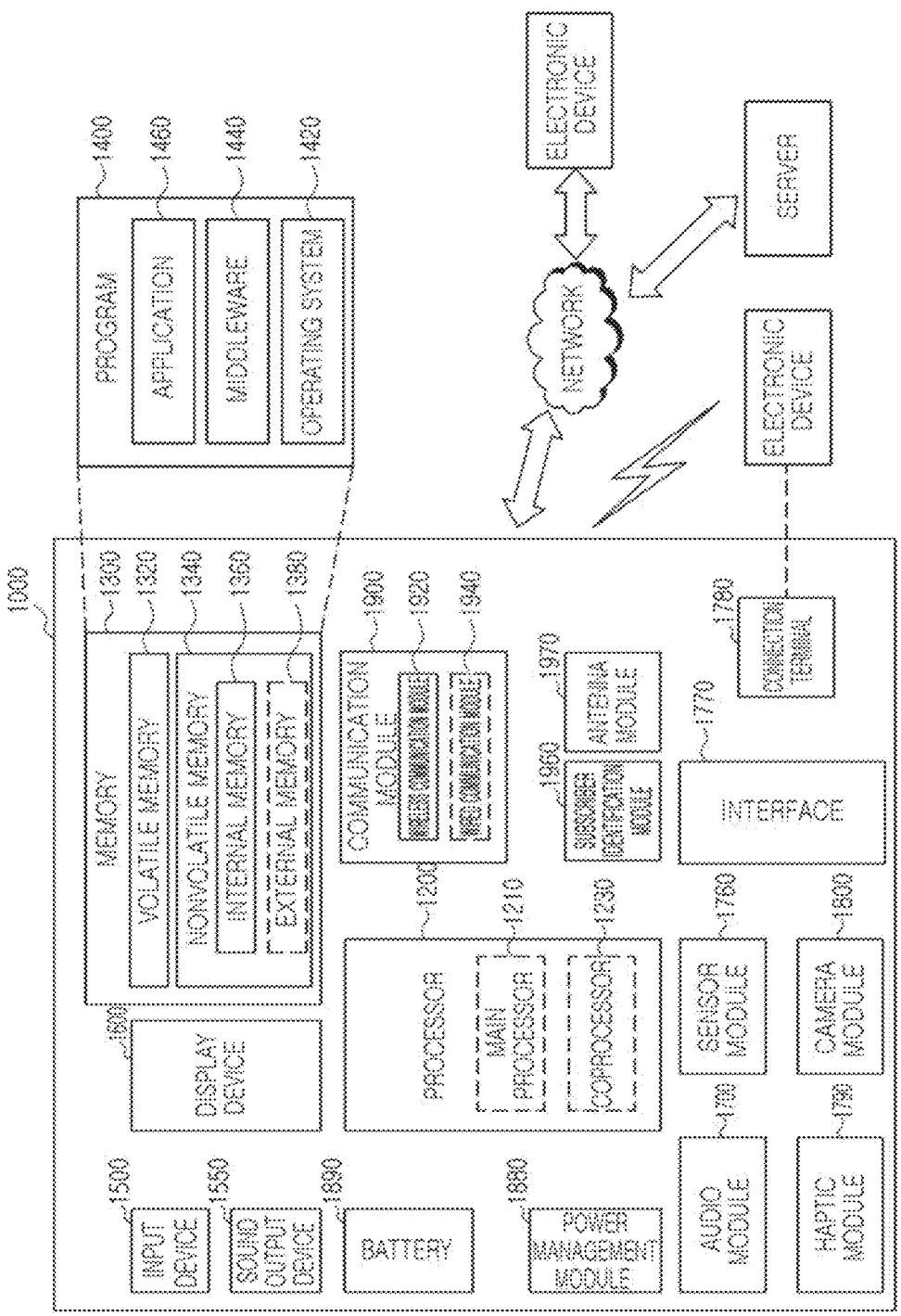
FIG. 18 is a block diagram of an electronic device according to an example embodiment.

FIG. 18 is a block diagram of an electronic device 1000 according to an example embodiment. In a network environment, the electronic device 1000 may communicate with other electronic devices through a first network (for example, short-range wireless communications) or another electronic device or a server through a second network (for example, long-range wireless communications).

Referring to FIG. 18, the electronic device 1000 may include a processor 1200, a memory 1300, an input device 1500, a sound output device 1550, a display device 1600, an audio module 1700, and a sensor module 1760, an interface 1770, a haptic module 1790, a camera module 1800, a power management module 1880, a battery 1890, a communications module 1900, a subscriber identification module 1960, and an antenna module 1970. According to various example embodiments, at least one of the components may be omitted or another component may be added to the electronic device 1000. For example, the display device 1600 may be implemented by integrating some components, such as in the case of an embedded sensor module 1760 (e.g., a fingerprint sensor, an iris sensor, or an illuminance sensor, etc.).

The processor 1200 may drive software (for example, a program 1400) to control at least one other component (for example, a hardware or software component) of the electronic device 1000 connected to the processor 1200, and may perform various data processing and operations.

The processor 1200 may load and process a command or data received from another component (for example, the sensor module 1760 and the communications module 1900) into a volatile memory 1320, and may store the result data in a nonvolatile memory 1340.

In example embodiments, the processor 1200 may operate independently of a main processor 1210 (e.g., a central processing unit or an application processor, etc.). Additionally/alternatively, the processor 1200 may include a coprocessor 1230 (e.g., a graphics processing processor, an image signal controller, a sensor hub processor, a communication processor, an artificial intelligence (AI) processor, etc.) using less power than the main processor 1210 or specialized in specified functions.

The coprocessor 1230 may be operated separately from the main processor 1210 or by being embedded. The coprocessor 1230 may replace the main processor 1210 while the main processor 1210 is in an inactive (sleep) state or may operate together with the main processor 1210 while the main processor 1210 is in an active state (application execution), to control at least a portion of functions or states associated with at least one (for example, the display device 1600, the sensor module 1760, or the communications module 1900) of the components of the electronic device 1000. In example embodiments, the coprocessor 1230 may be implemented as a portion of functionally-related other components (for example, the camera module 1800 or the communications module 1900).

The memory 1300 may store various data used by at least one component (for example, the processor 1200 or the sensor module 1760) of the electronic device 1000, for example, software, and input data or output data for instructions related thereto. The memory 1300 may include a volatile memory 1320 or a nonvolatile memory 1340.

The program 1400 is software stored in the memory 1300 and may include an operating system 1420, middleware 1440, or an application 1460.

The input device 1500 is a device for receiving a command or data to be used for a component (the processor 1200) of the electronic device 1000 from an external entity (a user) of the electronic device 1000, and may include, for example, a microphone, a mouse, or a keyboard.

The sound output device 1550 is a device for outputting an audio signal to the outside of the electronic device 1000. For example, the sound output device 1550 may include a speaker used for general usage, such as multimedia playback or recording playback, and a receiver used only for receiving a call. In an example embodiment, the receiver may be formed integrally or separately from the speaker.

The display device 1600 may be implemented to visually provide information to a user of the electronic device 1000. For example, the display device 1600 may include a display, a hologram device, a projector, and a control circuit controlling the device. In an example embodiment, the display device 1600 may include touch circuitry or a pressure sensor that may measure the strength of the pressure on the touch.

The audio module 1700 may bidirectionally convert a sound and an electrical signal. In an example embodiment, the audio module 1700 acquires sound through the input device 1500, or may output sound through the sound output device 1550 or an external electronic device (e.g., a speaker or a headphone, etc.) connected to the electronic device 1000 in a wired or wireless manner.

The sensor module 1760 may generate an electrical signal or data value corresponding to an internal operating state (e.g., power or temperature, etc.) of the electronic device 1000 or an external environmental state. For example, the sensor module 1760 may include a gesture sensor, a gyro sensor, an air pressure sensor, a magnetic sensor, an acceleration sensor, a grip sensor, a proximity sensor, a color sensor, an infrared (IR) sensor, a biometric sensor, a temperature sensor, a humidity sensor, or an illumination sensor.

The interface 1770 may support a designated protocol that may be connected to an external electronic device by wire or wirelessly. In an example embodiment, the interface 1770 may include a high definition multimedia interface (HDMI), a universal serial bus (USB) interface, an SD card interface, or an audio interface.

A connection terminal 1780 may include a connector (for example, an HDMI connector, a USB connector, an SD card connector, or an audio connector (a headphone connector)) for physically connecting the electronic device 1000 and an external electronic device.

The haptic module 1790 may convert an electrical signal into an electrical stimulus or a mechanical stimulus (e.g., vibrations or movement, etc.) that may be perceived by the user through the sense of touch or movement. The haptic module 1790 may include, for example, a motor, a piezoelectric element, or an electrical stimulation device.

The camera module 1800 may be configured to capture still images and videos. In example embodiments, the camera module 1800 may include one or more lenses, an image sensor, an image signal controller, or a flash. The camera module 1800 may control frame data, on which scanning operations are performed in different directions as described with reference to FIGS. 1 to 17, to output optimized frame data.

The power management module 1880 is a module for managing power supplied to the electronic device 1000, and may be configured, for example, as at least a portion of a power management integrated circuit (PMIC). The battery 1890 is a device supplying power to at least one component of the electronic device 1000 and may include, for example, a non-rechargeable primary battery, a rechargeable secondary battery, or a fuel cell.

The communication module 1900 may support establishment of a wired or wireless communication channel between the electronic device 1000 and an external electronic device and communication through the established communication channel. The communication module 1900 may include one or more communication processors supporting wired or wireless communication, which are operated independently of the processor 1200 (an application processor).

According to example embodiments, the communications module 1900 may include a wireless communications module 1920 (e.g., a cellular communication module, a short-range wireless communications module, or a global navigation satellite system (GNSS) communication module, etc.), or a wired communications module 1940 (e.g., a local area network (LAN) communications module, or a power line communications module, etc.). The communications module 1900 may communicate with an external electronic device through a first network (for example, a short-range communications network such as Bluetooth, Wi-Fi direct, or infrared data association (IrDA)) or a second network (for example, a telecommunication network such as a cellular network, Internet, or a computer network (LAN or WAN), etc.), using a corresponding wired/wireless communications module. In example embodiments, the communications module 1900 may be implemented in a single chip or in additional chips.

In example embodiments, the wireless communications module 1920 may distinguish and authenticate the electronic device 1000 in a communications network using user information stored in the subscriber identification module 1960.

The antenna module 1970 may include one or more antennas for transmitting or receiving signals or power to or from the outside. In example embodiments, the communications module 1900 may transmit a signal to or receive a signal from an external electronic device through an antenna appropriate for a communication method.

A portion of the components may be connected to each other via a communication method between peripheral devices, for example, a bus, a general purpose input/output (GPIO), a serial peripheral interface (SPI), or a mobile industry processor interface (MIPI), to exchange a signal (for example, commands or data) with each other.

In example embodiments, the command or data may be transmitted or received between the electronic device 1000 and an external electronic device through a server connected to the second network. The electronic devices may respectively be the same or different type of device as or from the electronic device 1000. According to an example embodiment, all or part of operations executed in the electronic device 1000 may be executed in another or a plurality of external electronic devices. According to an example embodiment, when the electronic device 1000 is to perform a function or service automatically or by request, the electronic device 1000 may request that the external electronic device perform at least some related functions, instead of or in addition to executing the function or service by itself. Upon receiving the request, the external electronic device may execute the requested function or additional function and may transmit the result to the electronic device 1000. The electronic device 1000 may provide the requested function or service by processing the received result as it is or additionally. To this end, for example, cloud computing, distributed computing, or client-server computing technology may be used.

The electronic device 1000 may be various types of devices. For example, the electronic device 1000 may include at least one of a portable communication device (for example, a smartphone), a computer device, a portable multimedia device, a portable medical device, a camera, a wearable device, or a home appliance, etc.

As used herein, the term "module" includes a unit composed of hardware, software, or firmware, and may be used interchangeably with terms such as logic, logic blocks, components, or circuits. The module may include various embodiments in document of integrally constructed components, which may be implemented in software (for example, the program 1400) including the instructions stored in machine (for example, computer)-readable storage media (for example, an internal memory 1360 or external memory 1380). The device may be a device capable of calling a stored command from a storage medium and operating according to the called command, and may include an electronic device (for example, the electronic device 1000) according to the example embodiments. When an instruction is executed by a processor (for example, the processor 1200), the processor may perform a function corresponding to the instruction directly by the processor or by using other components under the control of the processor. The instruction may include code generated or executed by a compiler or interpreter. The machine-readable storage medium may be provided in the form of a non-transitory storage medium. In this case, 'non-transitory' means that the storage medium does not include a signal and is tangible, but does not distinguish that data is stored semi-permanently or temporarily on the storage medium.

As described above, in an image sensor according to an example embodiment, an imaging device including the image sensor, and a method of operating the imaging device, scanning operations may be performed on a single pixel array in a plurality of directions to significantly reduce a propagation delay effect.

Further, in an image sensor according to an example embodiment, an imaging device including the image sensor, and a method of operating the imaging device, an operation may be performed on frame data, output by different readout circuits, for a single pixel array to obtain frame data. Thus, fixed pattern noise (FPN) caused by a deviation between the readout circuits may be attenuated.

While example embodiments have been shown and described above, it will be apparent to those skilled in the art that modifications and variations could be made without departing from the scope of the present inventive concept as defined by the appended claims.

What is claimed is:

1. An image sensor comprising:
a pixel array including a plurality of pixels disposed between a plurality of row lines and a plurality of column lines;
a first selection circuit disposed below the pixel array, connected to the plurality of row lines, and configured to perform a first selection operation to select one of the plurality of row lines;
a second selection circuit disposed above the pixel array, connected to the plurality of row lines, and configured to perform a second selection operation to select one of the plurality of row lines;
a first readout circuit disposed on the left of the pixel array, connected to the plurality of column lines, and configured to receive pixel voltages from pixels connected to the selected row line and the plurality of column lines and to output pixel data corresponding to the received pixel voltages, the first readout circuit being enabled in correspondence with one enabled selection circuit among the first selection circuit and the second selection circuit; and
a second readout circuit disposed on the right of the pixel array, connected to the plurality of column lines, and configured to receive pixel voltages from the selected row line and the plurality of column lines and to output pixel data corresponding to the received pixel voltages, the second readout circuit being enabled in correspondence with the other enabled selection circuit among the first selection circuit and the second selection circuit,
wherein the first selection circuit performs the first selection operation in a first direction, and
the second selection circuit performs the second selection operation in a second direction, different from the first direction.

2. The image sensor of claim 1, wherein the first direction is a direction from a left side of the pixel array to a right side of the pixel array, and
the second direction is a direction from the right side of the pixel array to the left side of the pixel array.

3. The image sensor of claim 1, wherein the second selection circuit is enabled after the first selection circuit is enabled.

4. The image sensor of claim 1, wherein the first selection circuit and the second selection circuit are simultaneously enabled.

5. The image sensor of claim 4, wherein a first scanning operation performed by the first selection circuit starts from an upper left portion of the pixel array, and
a second scanning operation performed by the second selection circuit starts from a lower right portion of the pixel array.

6. The image sensor of claim 4, wherein a first scanning operation performed by the first selection circuit starts from a lower left portion of the pixel array, and
a second scanning operation performed by the second selection circuit starts from an upper right portion of the pixel array.

7. The image sensor of claim 6, wherein first frame data corresponding to the first scanning operation are output from one of the first readout circuit and the second readout circuit, and
second frame data corresponding to the second scanning operation are output from the other one of the first readout circuit and the second readout circuit.

8. A method of operating an imaging device, the method comprising:
performing a first scanning operation on a pixel array including a plurality of pixels disposed between a plurality of row lines and a plurality of column lines to generate first frame data, the first scanning operation being performed in a first direction by a first selection circuit and a first readout circuit;
performing a second scanning operation on the pixel array to generate second frame data, the second scanning operation being performed in a second direction different from the first direction, by a second selection circuit and a second readout circuit; and
merging, by an image signal processor, the first frame data and the second frame data,
wherein the plurality of column lines are connected to the first readout circuit and the second readout circuit, and
wherein the first scanning operation comprises enabling the first readout circuit in correspondence with the first selection circuit, and the second scanning operation comprises enabling the second readout circuit in correspondence with the second selection circuit.

9. The method of claim 8, wherein each of the plurality of pixels comprises:
a photodiode connected to a ground terminal;
a first transistor connected between the photodiode and a floating diffusion node and activated in response to a transfer gating signal;
a second transistor connected between a power supply terminal and the floating diffusion node and activated in response to a rest gating signal;
a third transistor having a drain connected to the power supply terminal and a gate connected to the floating diffusion node; and
a fourth transistor having a drain connected to a source of the third transistor, a source connected to a corresponding column line among the plurality of column lines, and a gate connected to the first selection circuit and the second selection circuit.

10. The method of claim 9, wherein pixel data is output by the second scanning operation after the pixel data is output from each of the plurality of pixels by the first scanning operation.

11. The method of claim 8, wherein each of the plurality of pixels is implemented with a 2-PD structure.

12. The method of claim 8, wherein each of the plurality of pixels includes a dynamic vision sensor (DVS) pixel.

13. The method of claim 12, further comprising:
holding first pixel data generated by the first scanning operation until the first frame data are configured; and
holding second pixel data generated by the second scanning operation until the second frame data are configured.

14. The method of claim 8, wherein the merging includes calculating an average value of the first frame data and the second frame data.

15. The method of claim 8, further comprising:
outputting the first frame data to the image signal processor by a first path corresponding to the first scanning operation; and
outputting the second frame data to the image signal processor by a second path corresponding to the second scanning operation.

* * * * *